United States Patent
Chudzik et al.

(10) Patent No.: US 8,138,041 B2
(45) Date of Patent: Mar. 20, 2012

(54) IN-SITU SILICON CAP FOR METAL GATE ELECTRODE

(75) Inventors: Michael P. Chudzik, Danbury, CT (US); Troy Graves-Abe, Wappingers Falls, NY (US); Rashmi Jha, Toledo, OH (US); Renee T. Mo, Briarcliff Manor, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 440 days.

(21) Appl. No.: 12/137,745

(22) Filed: Jun. 12, 2008

(65) Prior Publication Data

US 2009/0308636 A1 Dec. 17, 2009

(51) Int. Cl.
*H01L 21/203* (2006.01)

(52) U.S. Cl. ........ 438/216; 438/197; 438/591; 257/288; 257/410; 257/411

(58) Field of Classification Search .......................... None
See application file for complete search history.

(56) References Cited

U.S. PATENT DOCUMENTS

| | | | |
|---|---|---|---|
| 5,330,921 A * | 7/1994 | Yoshida et al. | 438/294 |
| 6,750,124 B1 * | 6/2004 | Mitan et al. | 438/583 |
| 6,774,463 B1 | 8/2004 | Chaudhari et al. | |
| 2001/0009804 A1 * | 7/2001 | Maekawa | 438/637 |
| 2006/0211236 A1 * | 9/2006 | Bureau et al. | 438/628 |
| 2006/0284179 A1 * | 12/2006 | Jung et al. | 257/59 |
| 2007/0212895 A1 * | 9/2007 | Chua et al. | 438/758 |
| 2008/0132059 A1 * | 6/2008 | Noguchi et al. | 438/643 |
| 2008/0164536 A1 * | 7/2008 | Luan et al. | 257/407 |
| 2008/0164581 A1 * | 7/2008 | Cho et al. | 257/632 |
| 2008/0242108 A1 * | 10/2008 | Chang et al. | 438/763 |
| 2008/0251815 A1 * | 10/2008 | Goldbach et al. | 257/255 |

* cited by examiner

*Primary Examiner* — N Drew Richards
*Assistant Examiner* — Peter Bradford
(74) *Attorney, Agent, or Firm* — Yuanmin Cai; Hoffman Warnick LLC

(57) ABSTRACT

Structure and method of improving the performance of metal gate devices by depositing an in-situ silicon (Si) cap are disclosed. A wafer including a substrate and a dielectric layer is heated through a degas process, and then cooled to approximately room temperature. A metal layer is then deposited, and then an in-situ Si cap is deposited thereon. The Si cap is deposited without vacuum break, i.e., in the same mainframe or in the same chamber, as the heating, cooling and metal deposition processes. As such, the amount of oxygen available for interlayer oxide regrowth during subsequent processing is reduced as well as the amount oxygen trapped in the metal gate.

9 Claims, 4 Drawing Sheets

US 8,138,041 B2

IN-SITU SILICON CAP FOR METAL GATE ELECTRODE

BACKGROUND

1. Technical Field

The disclosure relates generally to metal gate electrode fabrication, and more particularly, to forming an in-situ silicon (Si) cap for a metal gate electrode.

2. Background Art

In the integrated circuit (IC) fabrication industry, metal gate electrodes are increasingly being used as a replacement for doped polysilicon (poly-Si) gate electrodes for a number of reasons. A metal, for example, Titanium Nitride ($TiN_x$), is deposited by physical vapor deposition (PVD) to form a metal gate electrode. A Si layer is then deposited over the metal layer. However, as deposited, the metal, i.e., $TiN_x$, is not very densely packed and absorbed oxygen and water in the environment can exit from the deposition chamber. During subsequent processing, the trapped oxygen containing species can cause a re-growth of interfacial oxide on the Si layer, causing extra Silicon Oxide (SiO) layers to be formed. As a result, the metal gate electrode becomes thicker than designed. The extra trapped oxygen and contaminants can also affect the properties of the metal gate hence formed.

SUMMARY

Structure and method of improving the performance of metal gate devices by depositing an in-situ Si cap are disclosed.

A first aspect of the disclosure provides a method comprising: providing a substrate; depositing a dielectric layer on the substrate; heating the substrate and the dielectric layer; cooling the substrate and the dielectric layer; depositing a metal layer on the dielectric layer; and depositing a silicon (Si) cap on the metal layer; wherein the Si cap is deposited without vacuum break from the heating, cooling or metal deposition processes.

A second aspect of the disclosure provides a metal gate electrode comprising: a first layer consisting of a substrate; a second layer consisting of a dielectric layer; a third layer consisting of a metal layer; and a fourth layer consisting of a silicon (Si) cap; wherein the Si cap is deposited without vacuum break from the deposition of the metal layer.

The illustrative aspects of the present disclosure are designed to solve the problems herein described and/or other problems not discussed.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
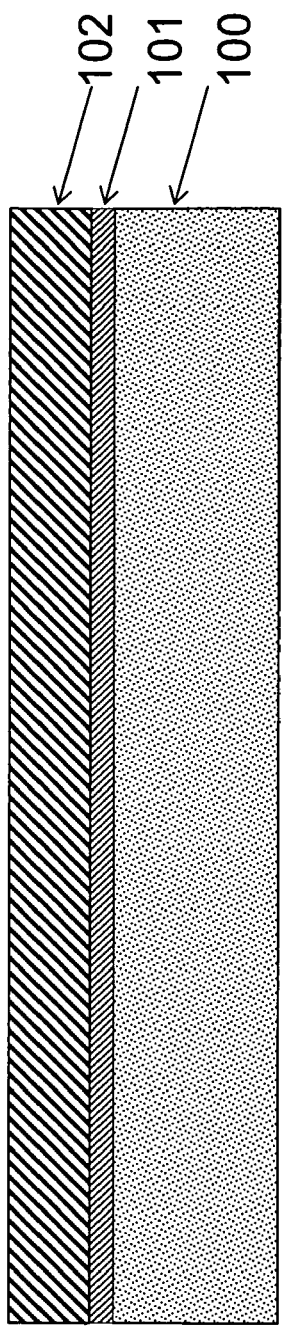
FIGS. 1-2 show the metal gate electrode disclosed in this disclosure.
Figure 2:
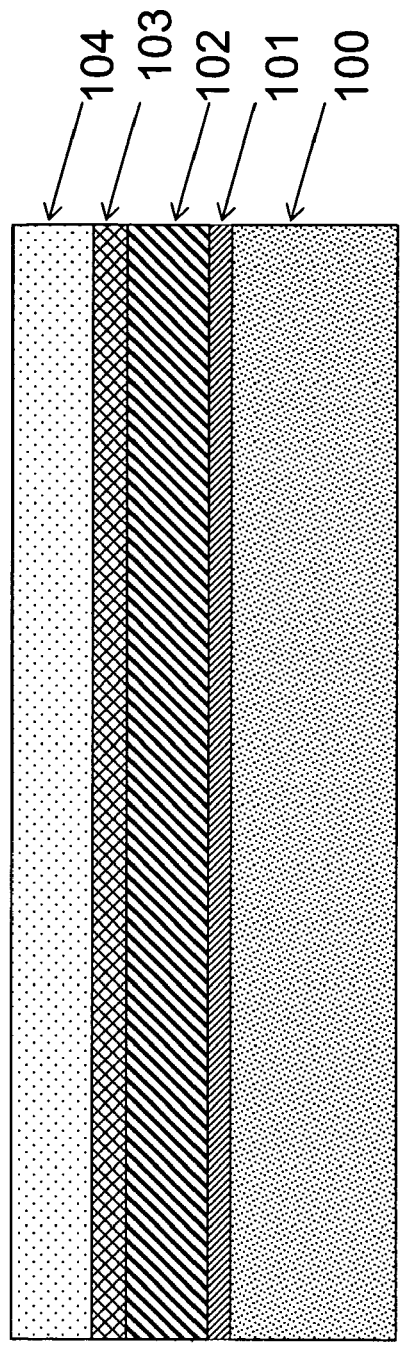
Figure 3:
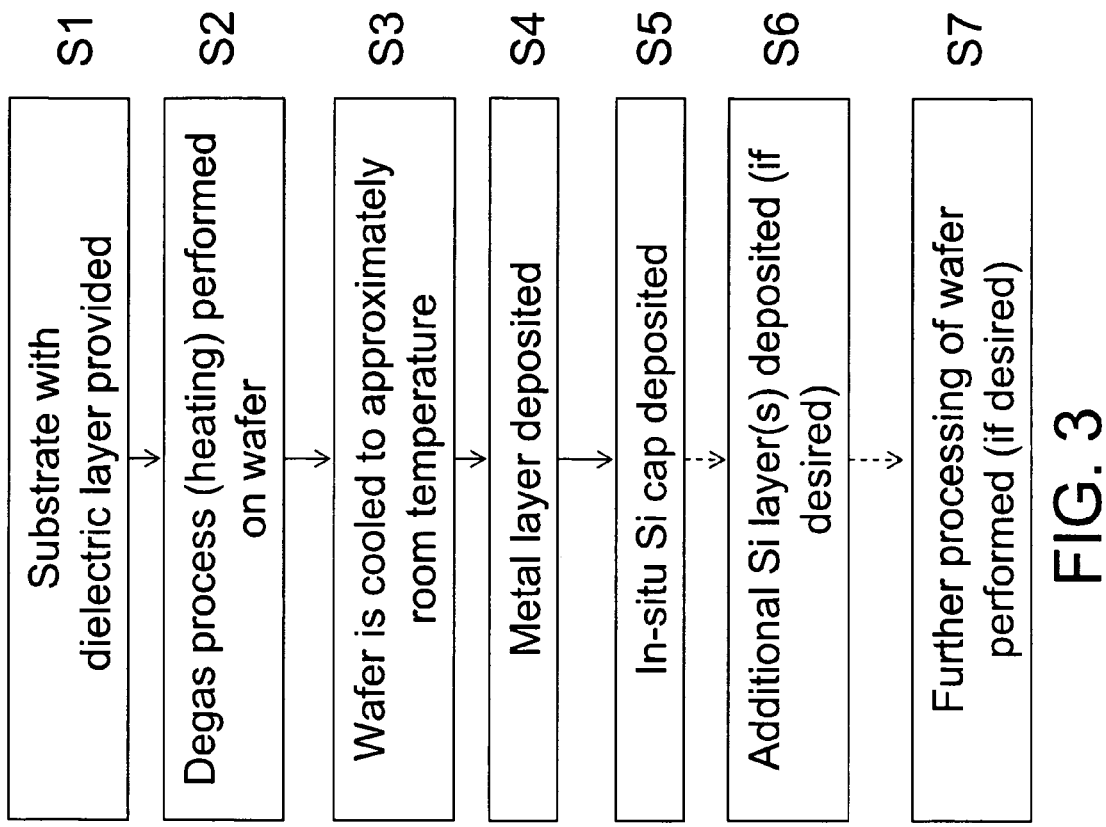
FIG. 3 shows a flowchart of the method disclosed in this disclosure.

Referring to the drawings, embodiments of the structure and method according to the disclosure are shown in FIGS. 1-3. FIG. 1 shows providing a substrate 100. Next, a dielectric layer 101 is deposited using conventional deposition techniques such as chemical vapor deposition (CVD), atomic layer deposition (ALD) or physical vapor deposition (PVD). The dielectric layer can be Silicon Oxide ($SiO_2$), Silicon Oxide Nitride ($SiO_xN_y$), or a high dielectric constant (high K) such as Hafnium Oxide (HfO), Hafnium Silicon Oxide ($HfSi_xO_y$), Aluminum Oxide ($Al_2O_3$), or Barium Strontium Titanate (BSTO).

After layer 101 is deposited, a degas process is performed on the wafer. The degas process drives off the absorbed oxygen containing species, i.e., water and other impurities in the air. The degas process is performed at a temperature of approximately 150° C.-350° C. for approximately 1-5 minutes in the presence of an inert gas such as Argon (Ar), Helium (He), Xenon (Xe) or Krypton (Kr) at approximately 2 to 50 Torr pressure. After this degas process (i.e., heating process), the wafer is then cooled to approximately room temperature in the inert gas environment. Cooling the wafer to within approximately 50° C. of room temperature will be sufficient for the purposes of this process. This heating and subsequent cooling are performed in a degas and cool down chamber, respectively. The degas and cool down chambers reside in the same mainframe as the metal deposition chamber so that the wafer is not subjected to a vacuum break in between these three processes. The heating and cooling processes reduce the amount of oxygen available for interlayer oxide regrowth during subsequent processing as well as the amount of oxygen trapped in the metal gate as discussed below.

As shown in FIG. 2, after the wafer is heated and then cooled, a metal layer 102 is deposited on dielectric layer 101. The metal layer can be any metal capable of being used for metal gate electrodes, including but not limited to Titanium Nitride ($TiN_x$), Tantalum Nitride ($TaN_x$), Tantalum Silicon Nitride ($TaSi_xN_y$) Tantalum Carbide ($TaC_x$), Tungsten Nitride ($WN_x$), Molybdenum Nitride ($MoN_x$), Molybdenum Silicon Nitride ($MoSiN_x$), Titanium Aluminum ($TiAl_x$), Titanium Aluminum Nitride ($TiAl_xN_y$), Ruthenium (Ru) or a combination of the foregoing. The metal can be deposited using conventional techniques, including PVD, CVD or ALD.

After metal layer 102 is deposited, an in-situ Si cap 103 is deposited over the metal layer. The Si cap can be deposited using traditional methods, including by physical vapor deposition (PVD) sputtering in a sputtering power range of approximately 0.1 to 10 $W/cm^2$ of Si target area, in the presence of Argon. This Si cap 103 is termed "in-situ" because the wafer is not removed from the mainframe before the Si cap 103 is deposited, i.e., the wafer is in the same mainframe as for the deposition, heating and cooling processes discussed above. The heating, cooling, metal deposition and Si cap deposition can be performed in different chambers within the same mainframe, or the metal deposition and Si cap deposition can be performed in the same chamber, wherein the chamber is equipped with multiple target deposition capabilities. Other configurations may be used that ensure that the Si cap is deposited without a vacuum break from the heating, cooling, or metal deposition processes. In this way, no additional contaminants will be trapped between the layers of the metal gate electrode. As discussed above, the heating and cooling processes performed earlier in the process have already reduced the amount of oxygen and other contaminants that are present in the mainframe. Depositing the Si cap 103 in-situ, before further contaminants or oxygen can be introduced, provides a cap that protects the metal layer 102. The Si cap 103 may be approximately 100-120 Å thick. However, the Si cap may be thinner, or as thick as desired. It is only necessary that the thickness of the Si cap be at least in the range of approximately 25-200 Å to adequately seal, or cap, the metal layer 102.

In typical practice, a thick layer Si layer (approximately 600 Å to 1500 Å) is deposited in one step (typically in a separate CVD chamber). In contrast, in this disclosure, a thinner in-situ Si cap 103 is deposited as discussed above, and then once the interface between the metal layer and the Si layer is sealed by the Si cap 103, a second optional additional Si layer 104 (or layers) can be deposited by traditional methods (e.g., PVD, CVD, or AVD) to achieve a desired thickness. This two Si step process allows a user to achieve a desired thickness, while also reducing the amount of contaminants in the interface between the metal and Si layers by depositing the first Si layer in-situ without a vacuum break from the deposition of the previous layers. The metal gate electrode can then be further processed to include desired elements and layers, for example, gate patterning, spacer formation, source/drain implant and activation, silcides, contacts and/or BEOL interconnects formations. The novel process of this disclosure yields improved electrical results for the metal gate electrodes, and as discussed below with respect to FIGS. 4 and 5, testing results show that this is due to a decreased amount of carbon and oxygen between the metal and Si layer.

FIG. 3 shows a flowchart of the method disclosed in this disclosure. In process S1, a substrate is provided with a dielectric layer deposited thereon. In process S2, a degas, or heating, process is performed at a temperature of approximately 150° C.-350° C. for approximately 1-5 minutes in the presence of an inert gas such as Argon (Ar), Helium (He), Xenon (Xe) or Krypton (Kr) at approximately 2 to 50 Torr pressure. In process S3, the wafer is cooled to within approximately 50° C. of room temperature in the inert gas environment. In process S4, a metal layer, such as including but not limited to Titanium Nitride ($TiN_x$), Tantalum Nitride ($TaN_x$), Tantalum Silicon Nitride ($TaSi_xN_y$), Tantalum Carbide ($TaC_x$), Tungsten Nitride ($WN_x$), Molybdenum Nitride ($MoN_x$), Molybdenum Silicon Nitride ($MoSiN_x$), Titanium Aluminum ($TiAl_x$), Titanium Aluminum Nitride ($TiAl_xN_y$), Ruthenium (Ru) or a combination thereof is deposited. In process S5, in-situ Si cap 103 is deposited. Processes 51 through S5 are performed without vacuum break, e.g., in chambers in the same mainframe, to reduce the amount of oxygen or other contaminants that are exposed to the layers of the metal gate electrode. In processes S6 and S7, further processing can be performed as desired to increase the thickness of the Si layer and/or to add desired elements.

Figure 4:
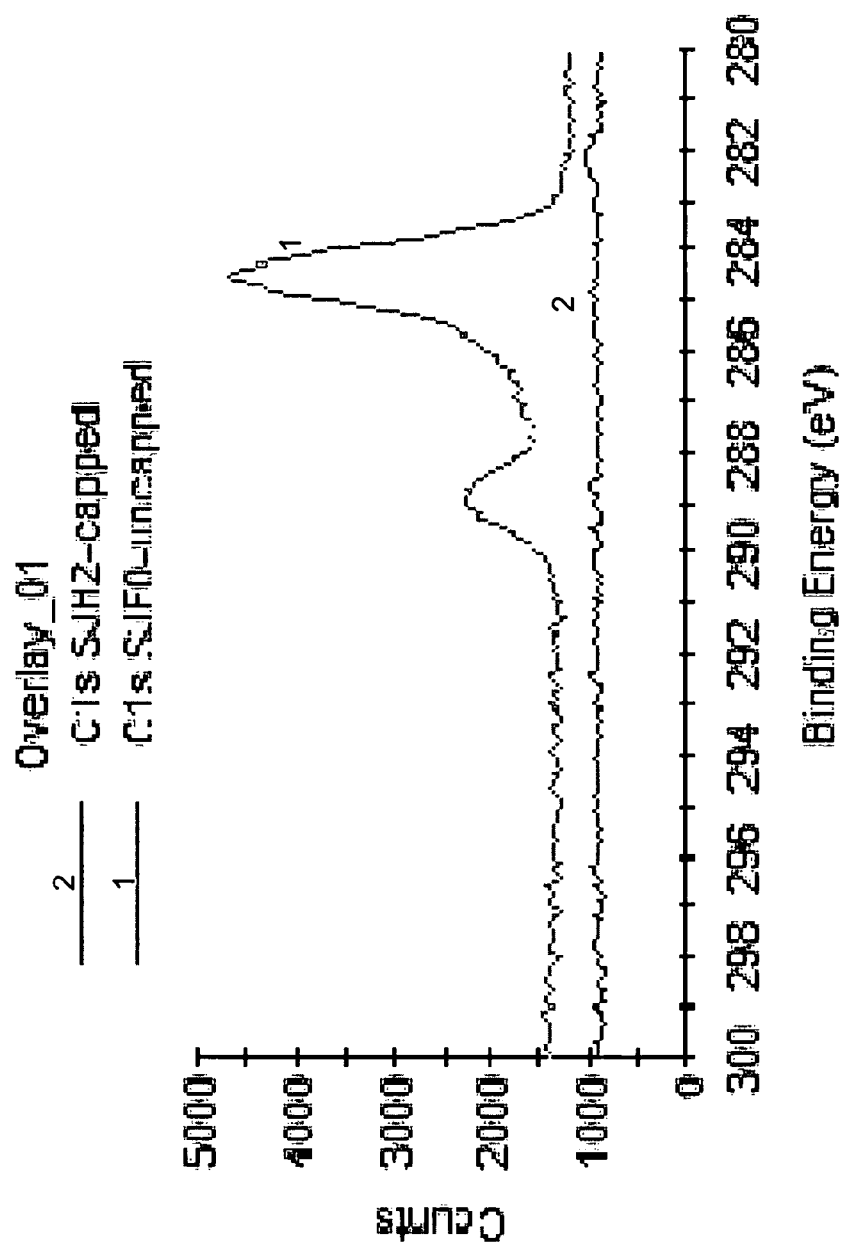
FIGS. 4-5 show testing results for the presence of carbon and oxygen when utilizing the metal gate electrode disclosed in this disclosure in comparison to traditional metal gate electrodes.

FIG. 4 is a graph depicting testing results of the level of carbon present in the interface between a metal layer and a Si layer from two samples of metal gate electrodes. The first sample, depicted by the upper line (line 1) in FIG. 4, is a traditionally formed metal gate electrode, i.e., without the in-situ Si cap of this disclosure. The second sample, depicted by the lower line (line 2) in FIG. 4, is a metal gate electrode with the in-situ Si cap of this disclosure. As FIG. 4 shows, there is minimal carbon present in the interface between the metal layer and the Si Cap in the second sample as compared to the first sample.

Figure 5:
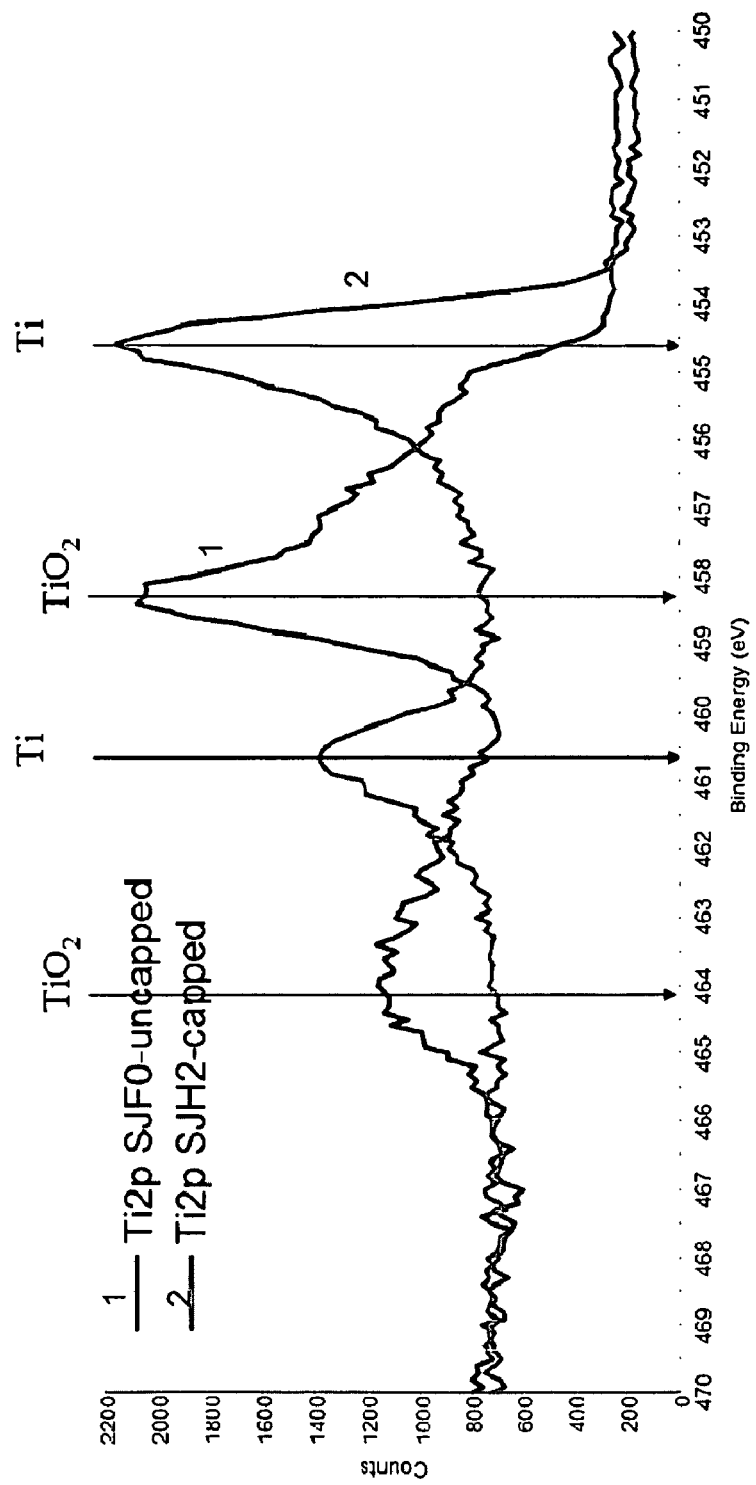

FIG. 5 is a Ti plot of the levels of oxidized Ti present in the interface between a metal layer and a Si layer from two samples of metal gate electrodes. The first sample, shown as line 1 in FIG. 5, is a traditionally formed metal gate electrode, i.e., without the in-situ Si cap of this disclosure. This line shows that there are two Ti—O peaks at approximately 464 and 458 ev, and no unoxidized Ti peaks. In other words, in the interface between the metal layer (Ti) and the silicon layer, there is sufficient oxygen present to bond with the Ti. The second sample, shown as line 2 in FIG. 5, is a metal gate electrode with the in-situ Si cap of this disclosure. This line shows no Ti—O peaks, but two strong unoxidized Ti peaks at approximately 454.6 and 460.6 ev. In other words, in the interface between the metal layer (Ti) and the silicon layer, there is negligible oxygen present to bond with the Ti. Therefore, as FIG. 5 shows, there is much less oxygen present in the interface between the metal layer and the Si Cap in the second sample as compared to the first sample.

The foregoing description of various aspects of the disclosure has been presented for purposes of illustration and description. It is not intended to be exhaustive or to limit the disclosure to the precise form disclosed, and obviously, many modifications and variations are possible. Such modifications and variations that may be apparent to a person skilled in the art are intended to be included within the scope of the disclosure as defined by the accompanying claims.

What is claimed is:

1. A method comprising:
providing a substrate;
depositing a dielectric layer on the substrate;
heating the substrate and the dielectric layer in an inert gas environment;
cooling the substrate and the dielectric layer in the inert gas environment,
wherein the heating and cooling drives off absorbed oxygen containing species on the substrate;
depositing a metal layer on the dielectric layer;
depositing a silicon (Si) cap on the metal layer; wherein the Si cap has a thickness of approximately 25-200 angstrom (Å), and wherein the Si cap is deposited without a vacuum break from the heating, cooling or metal deposition processes;
removing the substrate, dielectric layer, metal layer, and Si cap from the vacuum break; and
depositing an additional Si layer on the Si cap layer to achieve a desired thickness.

2. The method of claim 1, wherein the heating is performed at a temperature of approximately 150° C.-350° C. for approximately 1-5 minutes.

3. The method of claim 2, wherein the inert gas is selected from the group consisting of Argon (Ar), Helium (He), Xenon (Xe) or Krypton (Kr) at approximately 2 to 50 Torr pressure.

4. The method of claim 1, wherein the cooling process cools the substrate and dielectric layer to within approximately 50° C. of room temperature.

5. The method of claim 1, wherein the metal layer is selected from the group consisting of Titanium Nitride ($TiN_x$), Tantalum Nitride ($TaN_x$), Tantalum Silicon Nitride ($TaSi_xN_y$), Tantalum Carbide ($TaC_x$), Tungsten Nitride ($WN_x$), Molybdenum Nitride ($MoN_x$), Molybdenum Silicon Nitride ($MoSiN_x$), Titanium Aluminum ($TiAl_x$), Titanium Aluminum Nitride ($TiAl_xN_y$), Ruthenium (Ru) or a combination thereof.

6. The method of claim 1, wherein the dielectric layer is selected from the group consisting of Silicon Oxide ($SiO_2$), Silicon Oxide Nitride ($SiO_xN_y$), Hafnium Oxide (HfO), Hafnium Silicon Oxide ($HfSi_xO_y$), Aluminum Oxide ($Al_2O_3$), or Barium Strontium Titanate (BSTO).

7. The method of claim 1, wherein the Si cap is deposited by physical vapor deposition (PVD) sputtering in a sputtering power range of approximately 0.1 to 10 W/cm$^2$ of Si target area, in the presence of Argon.

8. The method of claim 1, wherein the heating, cooling, metal deposition and Si cap deposition are performed in different chambers within the same mainframe.

9. The method of claim 1, wherein the metal deposition and Si cap deposition are performed in the same chamber, wherein the chamber is equipped with multiple target deposition capabilities.

* * * * *